(12) United States Patent
Lee

(10) Patent No.: US 6,636,081 B1
(45) Date of Patent: Oct. 21, 2003

(54) VOLTAGE-COMPARING DEVICE WITH ANALOG-SIGNAL CONVERTER

(75) Inventor: Ya-Pang Lee, Hsinchu (TW)

(73) Assignee: E-CMDS Corporation (TW)

( * ) Notice: Subject to any disclaimer, the term of this patent is extended or adjusted under 35 U.S.C. 154(b) by 3 days.

(21) Appl. No.: 10/106,088

(22) Filed: Mar. 26, 2002

(51) Int. Cl.[7] .................................................. H03K 5/22

(52) U.S. Cl. .............................. 327/72; 327/80; 327/77

(58) Field of Search .............................. 327/72, 74, 77, 327/80, 68, 70, 69, 62, 63

(56) References Cited

U.S. PATENT DOCUMENTS

| | | | | |
|---|---|---|---|---|
| 4,476,427 A | * | 10/1984 | Kaneko et al. ............. 323/234 |
| 4,489,436 A | * | 12/1984 | Yoshimura et al. ........... 381/51 |
| 5,986,831 A | * | 11/1999 | Muto ........................... 360/46 |
| 6,029,497 A | * | 2/2000 | Brinks et al. ................. 73/1.38 |
| 6,335,611 B1 | * | 1/2002 | Sasaki ......................... 320/134 |

\* cited by examiner

Primary Examiner—Tuan T. Lam
Assistant Examiner—Hiep Nguyen
(74) Attorney, Agent, or Firm—Volpe and Koenig, P.C.

(57) ABSTRACT

A voltage-comparing device applied in a cursor-control input device is provided. The voltage-comparing device includes an analog-signal converter obtaining an initial reference voltage for the follow-up device in an operational procedure corresponding to an input voltage and a comparing circuit sending a feedback to control the input resistance device, the reference voltage and the offset voltage for preventing the voltage comparing device from the disturbance of noises.

27 Claims, 21 Drawing Sheets

VOLTAGE-COMPARING DEVICE WITH ANALOG-SIGNAL CONVERTER

FIELD OF THE INVENTION

The present invention is related to a voltage-comparing device applied in a cursor-control input device, and more particularly, to a voltage-comparing device with an analog-signal converter.

BACKGROUND OF THE INVENTION

Following the development of the personal computer, peripheral devices of the personal computer also develops vigorously. Now, the software is well used in Window's interface system and the cursor-control input device becomes an essential peripheral device of the personal computer, wherein a mouse is applied popularly. FIG. 1 depicts a circuit of a prior mouse for detecting the movement of the position and transferring it into a digital control signal, wherein a light-emitting diode 11 provides a light emitted to a photo-transistor 13 and a raster-wheel 12 disposed between light-emitting diode 11 and the photo-transistor 13 rotates in response to the rotation of a ball included in the mouse. The photo-transistor 13 receives a bright/dark photo-signal and outputs a sine-wave-like current signal in response to the light-and shade photo-signal while the emitting light is influenced by the rotation of the raster-wheel 12. FIG. 2(a) illustrates an analog-input-voltage signal Vin transformed by a resistor 14 and FIG. 2(b) illustrates a digital-output-voltage signal Vout obtained in an ideal situation after a comparator 15 formed by an operational amplifier compares the analog input voltage signal Vin with a regulated reference voltage Vref. Accordingly, a follow-up circuit can calculate relative moving distances in X axle and Y axle of the mouse in response to the number of square waves of the digital-output-voltage signal Vout.

However, the prior art always causes a lot of uncontrollable errors during producing photoproducts. Parameter-errors and process-errors of devices also cause the yields of products to be reduced. Referring to FIG. 3, it illustrates signals of the photoproducts in the normal work. After comparing an input signal 30 with a regulated reference voltage 31, the part larger than the reference voltage 31 is defined as a digital signal 1, the part lower than the reference voltage 31 is defined as a digital signal 0 and then a digital signal 32 is obtained. Referring to FIG. 4, it illustrates an error of photoproducts. The photoproduct produces an under-potential-input signal 40 and an over-potential of the input signal 42 due to parameter-errors and process-errors and outputs error output signals 41 and 43 respectively. We can determine that the reduction in the yield is almost caused by above error signals, but not any broken device or error designs, which can be prevented through a good detection. Even though some people try to solve the problem by using more precision devices and machines, those methods increasing a lot of cost still can't solve the problem and improve the yield.

On the other hand, the effect of the noise during inputting signal is another problem. Referring to FIG. 11(a), it is an amplified drawing illustrating an input-voltage signal Vin similar to the regulated reference voltage Vref. As shown in FIG. 11(b), the digital input-voltage signal Vin and the regulated reference voltage Vref will cause crossover phenomenon several times because of the shift of power level and noises produced by transistor devices and background light. The digital output signals Vout will have abnormal numbers of square waves and that error will cause the follow-up circuit to calculate wrong and make the control cursor of the mouse move incorrectly.

Hence, the main purpose of the present invention is to overcome prior problems and provides a practical and novel voltage-comparing device.

SUMMARY OF THE INVENTION

It is one object of the present invention to provide a voltage-comparing device applied in a cursor-control input device.

It is another object of the present invention to provide a voltage-comparing device with an analog-signal converter for reducing the complexity of the circuit, the noise of all devices, and the cost of the voltage-comparing device.

According to the present invention, an analog-signal converter comprises a reference-voltage detecting circuit for outputting a reference-voltage signal in response to an input signal, and a first comparing device for comparing the input signal and the reference-voltage signal to obtain an output digital signal, wherein the reference-voltage detecting circuit comprises a second comparing device for comparing the input signal and a potential-calibrating signal to obtain an index signal, a voltage-follower control device electrically connected with the second comparing device for outputting a potential-control signal and a counting signal in response to the index signal and a pulse signal, a voltage-follower device electrically connected between the second comparing device and the voltage-follower control device for outputting the potential-calibrating signal in response to the potential-control signal, a detecting device electrically connected with the voltage-follower device and the voltage-follower control device for detecting the counting signal, the potential-calibrating signal and the pulse signal to obtain an extreme signal, an operational device electrically connected with the detecting device for operating the extreme signal to output an average signal, a signal converter electrically connected with the operational device for executing a signal-converting procedure by inputting the average signal to output a dynamic reference-voltage signal, and a pulse generator electrically connected with the voltage-follower device and the detecting device for producing the pulse signal to obtain the dynamic reference-voltage signal.

Certainly, the input signal can be an analog signal.

Certainly, the input signal can be a waveform signal obtained from a photoelectric convertion.

Certainly, the first comparing device can be a comparator.

Preferably, the comparator compares the input signal with the reference-voltage signal and obtains a first-state digital signal while the potential of the input signal is larger than that of the reference-voltage signal and a second-state digital signal while the potential of the input signal is smaller than that of the reference-voltage signal.

Preferably, the second comparing device further comprises an upper comparator and a lower comparator.

Preferably, the index signal further comprises an upper index signal outputted from the upper comparator and a lower index signal outputted from the lower comparator.

Preferably, the potential-calibrating signal further comprises a potential-calibrating upper signal and a potential-calibrating lower signal.

Preferably, the upper comparator outputs the upper index signal in response to the input signal and the potential-calibrating upper signal in the second comparing procedure.

Preferably, the lower comparator outputs the lower index signal in response to the input signal and the potential-calibrating lower signal in the second comparing procedure.

Certainly, the upper index signal and the lower index signal can be digital signals.

Preferably, the second comparator compares the input signal with the potential-calibrating signal for obtaining a first-state digital signal while the potential of the input signal is larger than that of the potential-calibrating and a second-state digital signal while the potential of the input signal is smaller than that of the potential-calibrating signal.

Preferably, the voltage-follower control device further comprises an input-voltage-tracing circuit and an up/down counter electrically connected with the input-voltage-tracing circuit.

Preferably, the input-voltage-tracing circuit outputs the counting signal in response to the index signal.

Preferably, the up/down counter outputs the potential-control signal in response to the counting signal in the operational procedure.

Preferably, the operational procedure further comprises an upper count procedure and a lower count procedure.

Preferably, the voltage-follower device further comprises a voltage-dividing serial resistor and an analog multiplexer connected with each other.

Certainly, the voltage-dividing serial resistor can comprise a plurality of series-connection resistors and divides an outer-voltage region into a plurality of potential regions.

Preferably, the analog multiplexer adjusts contacts between the analog multiplexer and the voltage-dividing serial resistor and obtains desired potential regions in response to the potential-control signal.

Preferably, the extreme signal further comprises a relative maximum signal and a relative minimum signal.

Certainly, the relative maximum signal and the relative minimum signal can be serial signals.

Preferably, the detecting device further comprises an extreme detecting circuit, a maximum latch and a minimum latch, wherein the maximum latch and the minimum latch connect to the extreme detecting circuit respectively.

Preferably, the operational device further comprises an average device and a signal-latch circuit.

Preferably, the average device outputs the average signal in response to the relative maximum signal and the relative minimum signal.

Preferably, the signal converter further comprises a voltage-dividing serial resistor and an analog multiplexer connected with each other.

Certainly, the signal-converting procedure can be a procedure of converting a digital signal into an analog signal.

Certainly, the operational procedure can be a procedure of obtaining an arithmetic average of the relative maximum and the relative minimum.

According to the present invention, a voltage-comparing device for comparing an input voltage with a reference voltage comprises a comparing circuit having a first voltage-input end, a second voltage-input end and a voltage-output end, wherein the input voltage and the reference voltage are inputted respectively through the first voltage-input end and the second voltage-input end, an output voltage is outputted at a first level value while the value of the input voltage is larger than that of the reference voltage, and an output voltage is outputted at a second level value while the value of the input voltage is smaller than that of the reference voltage, and a feedback control circuit electrically connected between the voltage-output end and the first voltage-input end to adjust the input voltage down a noise-enduring value for preventing the voltage-comparing device from the disturbance of the input voltage.

Certainly, the comparing circuit can be an operational-amplifier circuit.

Preferably, the first voltage-input end connects with a resistance device in parallel to convert an input current into an input voltage; and the feedback control circuit electrically connects with the voltage-output end and the resistance device to reduce the total resistance value of the resistance device for adjusting the input voltage down a noise-enduring value while the voltage-output end outputs the output voltage at the second level value.

Preferably, the resistance device further comprises a first resistor and a second resistor connected with the first resistor in series; and the feedback control circuit is a control switch electrically connected with the voltage-output and connected with the second resistor in parallel to short the second resistor for reducing the total resistance value of the resistance while the voltage-output end outputs the output voltage at the second level value.

Preferably, the control switch further comprises an inverter connected with the voltage-output end for converting the second level value into a conducting-voltage output value, and a MOS transistor having a gate electrically connected with the inverter and a source/drain electrically connected with the second resistor in parallel to be conducted in response to the conducting-voltage output value, thereby shorting the second resistor to reduce the total resistance value of the resistance.

Preferably, the resistance device further comprises a first resistor and a second resistor electrically connected with the first resistor in parallel, the feedback control circuit is a control switch electrically connected with the voltage-output, and the second resistor is serially connected to the ground to conduct the resistance device while the voltage-output end outputs the output voltage at the second level value, thereby connecting the second resistor with ground and reducing the total resistance value of the resistance device.

Preferably, the control switch further comprises an inverter electrically connected with the voltage-output end for converting the second level value into a conducting-voltage output value, and a MOS transistor having a gate electrically connected with the inverter and a source/drain serially connected to the ground for conducting the control switch in response to the conducting-voltage output value, thereby connecting the second resistor to the ground to reduce the total resistance value of the resistance device.

Certainly, the input current can be the current produced from an emitter of a phototransistor.

According to the present invention a voltage-comparing device for comparing an input voltage with a reference voltage, comprises a comparing circuit having a first voltage-input end, a second voltage-input end and a voltage-output end, wherein the input voltage and the reference voltage are inputted respectively through the first voltage-input end and the second voltage-input end, an output voltage is outputted at a first level value while the value of the input voltage is larger than that of the reference voltage, and an output voltage is outputted at a second level value while the value of the input voltage is smaller than that of the reference voltage, and a feedback control circuit electrically connected between the voltage-output end and the second voltage-input end for adjusting the input voltage down a noise-enduring value while the voltage-output end outputs the output voltage at the first level value, thereby preventing the voltage comparing device from the disturbance of the input voltage.

Certainly, the comparing circuit can be an operational-amplifier circuit.

Preferably, the second voltage-input end electrically connects with a resistance device for obtaining a partial voltage from a steady-voltage source to provide the reference voltage and the feedback control circuit electrically connects with the voltage-output end and the resistance device to reduce the total resistance value of the resistance device for adjusting the reference voltage down a noise-enduring value while the voltage-output end outputs the output voltage at the first level value.

Preferably, the resistance device further comprises a first resistor and a second resistor connected with the first resistor in series; and the feedback control circuit is a control switch connected with the voltage-output end and connected with the second resistor in parallel to short the second resistor for reducing the total resistance value of the resistance while the voltage-output end outputs the output voltage at the first level value.

Preferably, the control switch further comprises an inverter connected with the voltage-output end for converting the second level value into a conducting-voltage output value, and a MOS transistor having a gate electrically connected with the inverter and a source/drain connected with the second resistor in parallel to short the second resistor to reduce the total resistance value of the resistance device while the voltage-output end outputs the output voltage at the first level value.

Preferably, the resistance device further comprises a first resistor, and a second resistor connected with the first resistor in parallel, the feedback control circuit is a control switch connected with the voltage-output end, and the second resistor is connected to the ground in series to conduct the resistance device while the voltage-output end outputs the output voltage at the first level value, thereby connecting the second resistor with the ground and reducing the total resistance value of the resistance.

Preferably, the control switch further comprises an inverter electrically connected with the voltage-output end for converting the second level value into a conducting-voltage output value, and a MOS transistor having a gate electrically connected with the inverter and a source/drain connected to the ground in series for conducting the control switch in response to the conducting-voltage output value, thereby connecting the second resistor to the ground to reduce the total resistance value of the resistance device.

Certainly, the input voltage can be obtained from an input current crossing a ground resistor and the input electrical current is the current produced from an emitter of a phototransistor.

According to the present invention, a voltage-comparing device for comparing an input voltage with a reference voltage, comprises, a comparing circuit having a first voltage-input end, a second voltage-input end, a voltage-output end and a voltage-offset end, wherein the input voltage, the reference voltage and an offset voltage are inputted respectively through the first voltage-input end, the second voltage-input end and the voltage-offset end, an output voltage is outputted at a first level value while the sum value of the reference voltage and the offset voltage is smaller than the input voltage, and an output voltage is outputted at a second level value while the sum value of the reference voltage and the offset voltage is larger than the input voltage, and a feedback control circuit electrically connected between the voltage-output end and the second voltage-input end for adjusting the offset voltage down a noise-enduring value while the voltage-output end outputs the output voltage at the first level value, thereby preventing the voltage comparing device from the disturbance of the input voltage.

Certainly, the comparing circuit can be an operational-amplifier circuit.

Preferably, the second voltage-offset end electrically connects with a resistance device to obtain the offset voltage from a steady-voltage source to provide the offset voltage, and the feedback control circuit electrically connects with the voltage-output end and the resistance device to reduce total resistance value of the resistance device for adjusting the offset voltage down a noise-enduring value while the voltage-output end outputs the output voltage at the first level value.

Preferably, the resistance device further comprises a first resistor and a second resistor connected with the first resistor in series, the feedback control circuit is a control switch connected with the voltage-output end and connected with the second resistor in parallel to short the second resistor for reducing the total resistance value of the resistance device while the voltage-output end outputs the output voltage at the first level value.

Preferably, the control switch further comprises an inverter electrically connected with the voltage-output end for converting the second level value into a conducting-voltage output value, and a MOS transistor having a gate electrically connected with the inverter and a source/drain connected with the second resistor in parallel to short the second resistor for reducing the total resistance value of the resistance device while the voltage-output end outputs the output voltage at the first level value.

Preferably, the resistance device further comprises a first resistor and a second resistor connected with the first resistor in parallel, the feedback control circuit is a control switch electrically connected with the voltage-output, and the second resistor is connected to the ground to conduct the resistance device while the voltage-output end outputs the output voltage at the first level value, thereby connecting the second resistor with the ground and reducing the total resistance value of the resistance device.

Preferably, the control switch further comprises an inverter electrically connected with the voltage-output end for converting the second level value into a conducting-voltage output value, and a MOS transistor having a gate connected with the inverter and a source/drain connected to the ground for conducting the control switch in response to the conducting-voltage output value, thereby connecting the second resistor to the ground for reducing the total resistance value of the resistance device.

Certainly, the input voltage can be obtained from an input electrical current crossing a ground resistor and the input current is the current produced from an emitter of a phototransistor.

Now the foregoing and other features and advantages of the present invention will be more clearly understood through the following descriptions with reference to the drawings, wherein:

DETAILED DESCRIPTION OF THE PREFERRED EMBODIMENT

Figure 5:
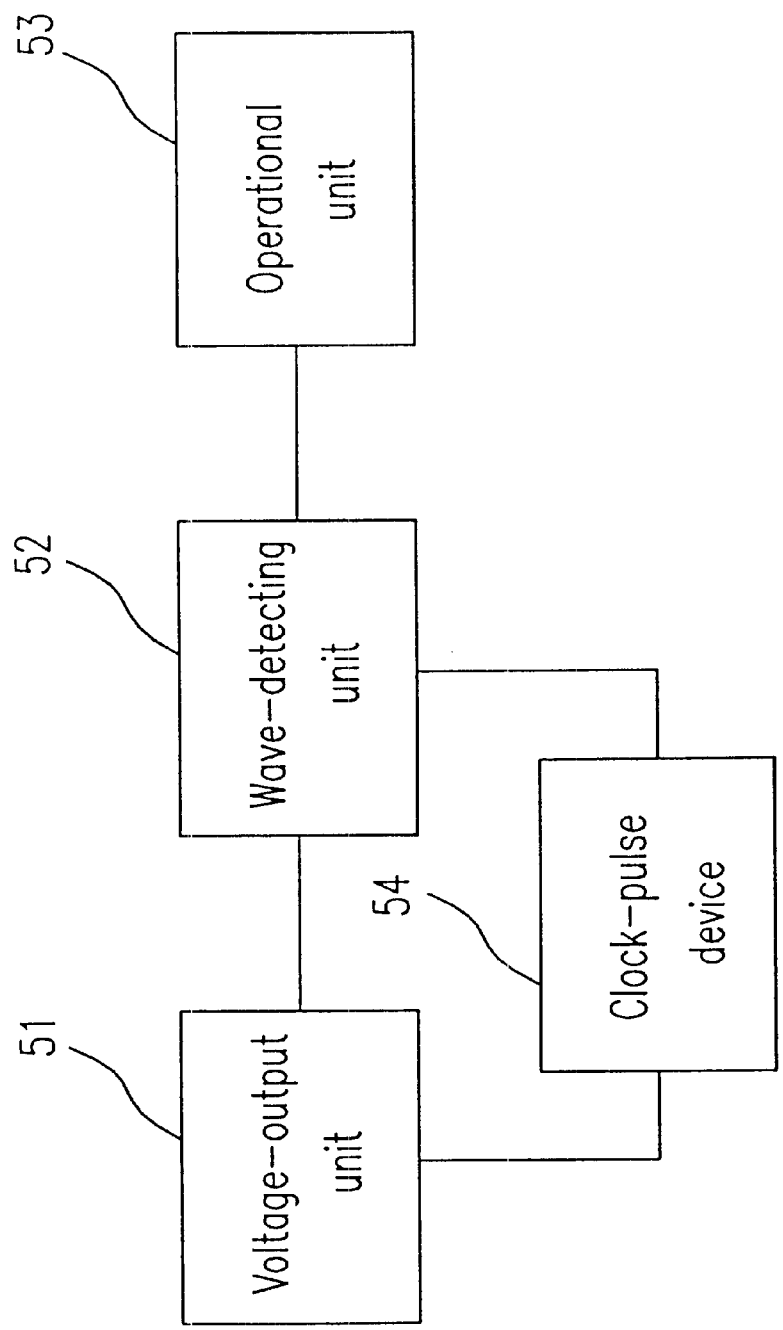
FIG. 5 illustrates a flowchart of a preferred embodiment of an analog-signal converter according to the present invention.

Referring to FIG. 5, It illustrates a flowchart of a preferred embodiment of an analog-signal converter according to the present invention. The analog-signal comprises a reference-voltage detecting circuit 51 for outputting a reference-voltage signal in response to an input signal 50, and a first comparing device 52 for executing a first comparing procedure in response to the input signal 50 and the reference-voltage signal to obtain an output digital signal 53, wherein the reference-voltage signal is dynamically outputted and adjusted in response to the input signal 50. The reference-voltage detecting circuit 51 detects the shift of the input signal 50 and dynamically outputs the reference-voltage signal in the proper level corresponding to the input signal 50.

Figure 6:
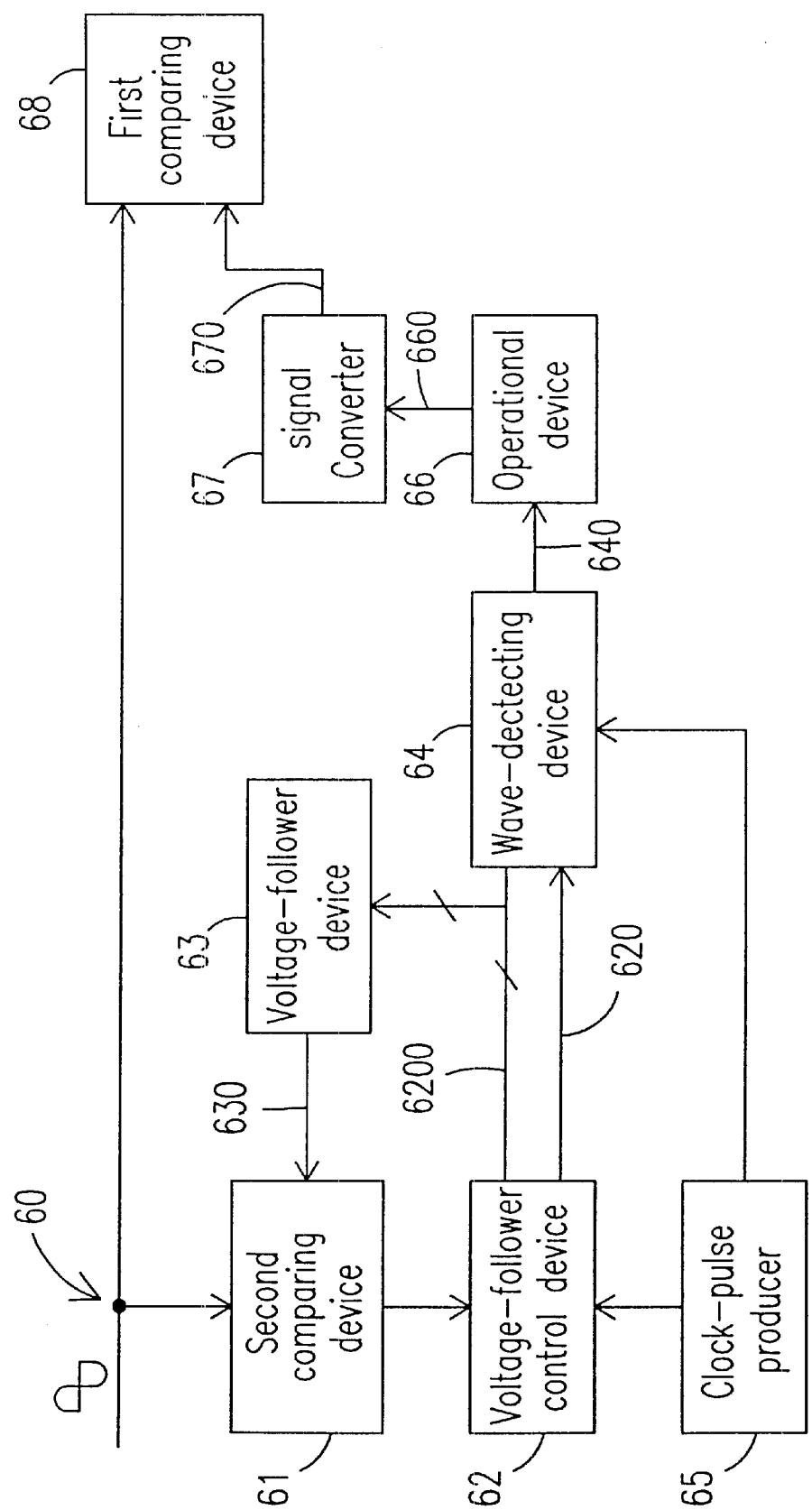
FIG. 6 illustrates a detailed flowchart of a preferred embodiment of an analog-signal converter according to the present invention.

Further referring to FIG. 6, it illustrates a detailed flowchart of a preferred embodiment of an analog-signal converter. The analog-signal converter comprises a first comparing device 68, a second comparing device 69, a voltage-follower control device 62, a voltage-follower device 63, and wave-detecting device 64, an operational device 66, a signal converter 67 and a clock-pulse generator 65. The second comparing device 61 executes a comparing procedure in response to the input signal 60 and a potential-calibrating signal 630 to obtain an index signal 610, wherein the second comparing device obtains the index signal 610 at state 1 while the input signal 60 is larger than the potential-calibrating signal 630 or obtain the index signal 610 at state 0 while the input signal 60 is lower than the potential-calibrating signal 630. The voltage-follower control device 62 electrically connects with the second comparing device 61 for outputting a potential-control signal 6200 and a counting signal 620 in response to the index signal 610 and a pulse signal, wherein the counting signal 620 includes a transmitting direction and a clock signal. The voltage-follower device 63 is electrically connected between the second comparing device 61 and the voltage-follower control device 62 for outputting the potential-calibrating signal 630 in response to the potential-control signal 630, wherein the potential-calibrating signal 630 is adjusted to be similar to the input signal 60 by the feedback effect of the second comparing device 61 and the voltage-follower control device 62. The wave-detecting device 64 is electrically connected with the voltage-follower device 63 and the voltage-follower control device 62 for executing a detecting procedure to determine if the input signal 60 has achieved an extreme signal in response to the transmitting direction and the clock signal of the counting signal 620. The wave-detecting device 64 obtains relative maximum extreme signal 640 while the accumulating direction of the potential signal changes from addition to subtraction, or otherwise obtains relative minimum extreme signal 640 signal while the accumulating direction of the potential signal changes from subtraction to addition. The operational device 66 is electrically connected with the wave-detecting device 64 for executing an operational procedure in response to the extreme signal 640 to output an average signal 640. The signal converter 67 is electrically connected with the operational device 66 for executing a signal-converting procedure in response to the average signal 660 to output a dynamic reference-voltage signal 670. The clock-pulse generator 65 is electrically connected with the voltage-follower device 63 and the wave-detecting device 64 for producing the pulse signal to obtain the dynamic reference-voltage signal.

Figure 7:
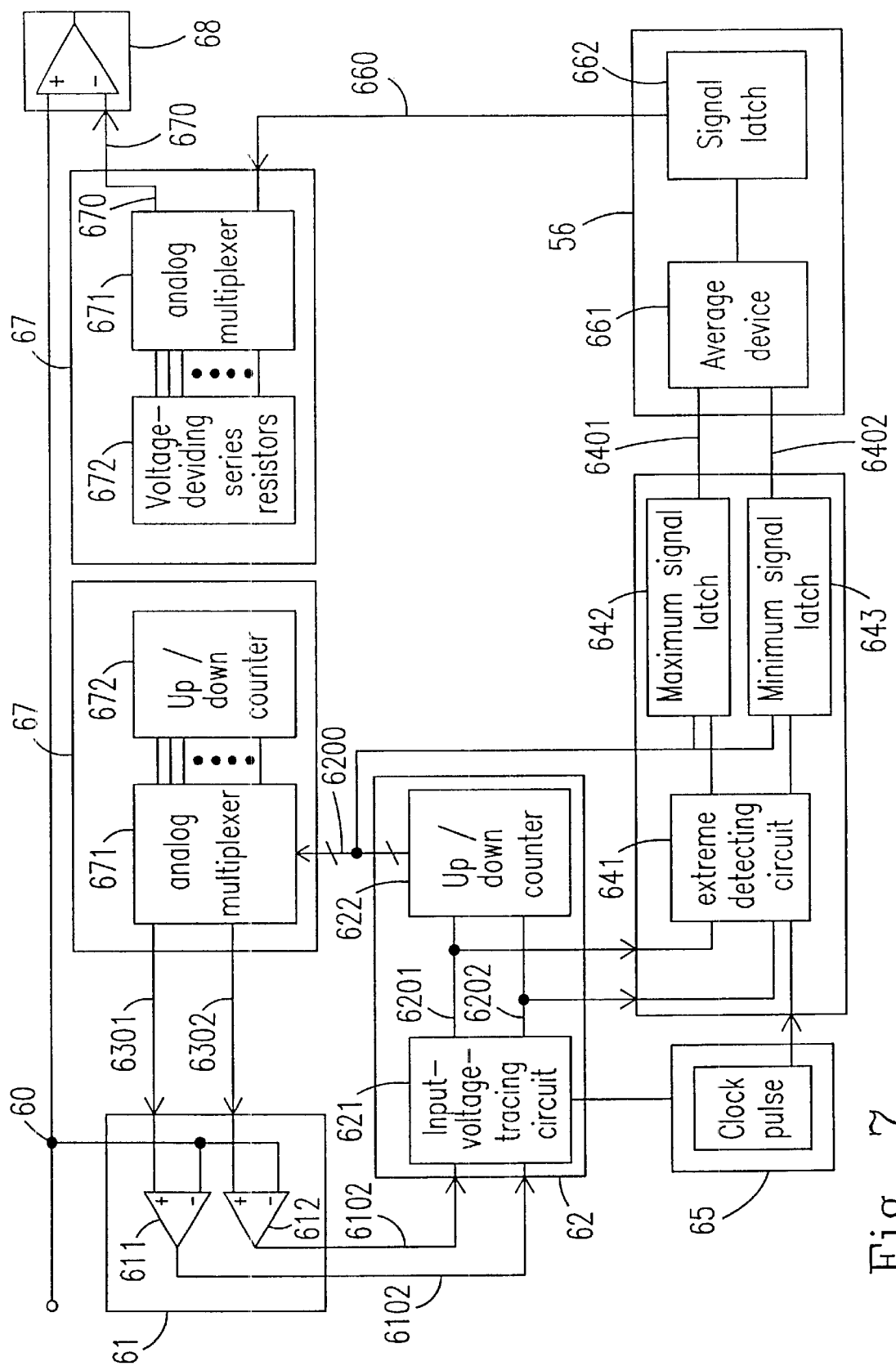
FIG. 7 illustrates a flowchart of a preferred embodiment of an analog-signal converter according to the present invention.

Referring to FIG. 7, it illustrates a flowchart of a preferred embodiment of an analog-signal converter of the present invention. Wherein, the first comparing device 68 is a comparator and the second comparing device 61 further comprises an upper comparator 611 and a lower comparator 612. The voltage-follower control device 62 further comprises an input-voltage-tracing circuit 621 and an up/down counter 622 electrically connected with the input-voltage-tracing circuit. The voltage-follower device 63 further comprises a voltage-dividing serial resistor 631 and an analog multiplexer 671. The second comparator 61 compares the input signal 60 with the upper potential-calibrating signal 6301 inputted to the upper comparator 611 and compares the input signal 60 with the lower potential-calibrating signal 6302. The upper potential-calibrating signal 6301 and the lower potential-calibrating signal 6302 are in voltage regions having regulated difference of voltage. Accordingly, the voltage level of the input signal 60 is above the voltage region while the states of the upper index signal 6101 and the lower index signal 6102 are outputted as 0, 0 respectively, the voltage level of the input signal 60 is below the voltage region while the states of the upper index signal 6101 and the lower index signal 6102 are outputted as 1, 1 respectively or the voltage level of the input signal 60 is in the voltage region while the states of the upper index signal 6101 and the lower index signal 6102 are outputted as 1, 0. Hence, the input-voltage-tracing circuit 621 outputs an accumulating-direction signal 6201 and a counting signal 6202 in response to the upper index signal 6101 and the lower index signal 6102 and controls the analog multiplexer 671 through the transmission of the up/down counter 622 electrically connected with the voltage-dividing serial resistor 672 corresponding to the accumulating-direction signal 6201 and the counting signal 6202. The voltage level of the upper potential-calibrating signal 6301 and the lower potential calibrating signal 6302 are similar to that of the input signal 60. The procedures of comparing signals and adjusting the joint point of the voltage-dividing serial resistors 672 are continued and the potential-shift of the input signal 60 won't influence the follow-up circuit.

The wave-detecting device 64 further comprises an extreme detecting circuit 641, a maximum latch 642 and a minimum latch 643, wherein the maximum latch 642 and the minimum latch 643 connect to the extreme detecting circuit 641 respectively. The operational device 66 further comprises an average device 661 and a signal-latch circuit 662. The signal converter 67 further comprises a voltage-dividing serial resistor 672 and an analog multiplexer 671 connected with each other. When the input signal 60 achieves the extreme value, the accumulating-direction signal 6201 outputted from the extreme detecting circuit 641 must be changed. The extreme detecting circuit 641 respectively detects and inputs the inputs 6201,6202 and the potential-control signal 6200 into the maximum latch 642 and the minimum latch 643, and then the average device 661 obtains an arithmetic average of the relative maximum signal 6401 and the relative minimum signal 6402 and stores them into the signal latch 662.

The signal 660 stored in the signal latch 662 and the potential-control signal 6200 are in the same forms. Hence, the signal 660 is inputted into the voltage-dividing serial resistor 672 having the potential at the same value of the potential-control signal 6200 and the analog multiplexer to obtain the reference voltage signal 670.

Figure 8:
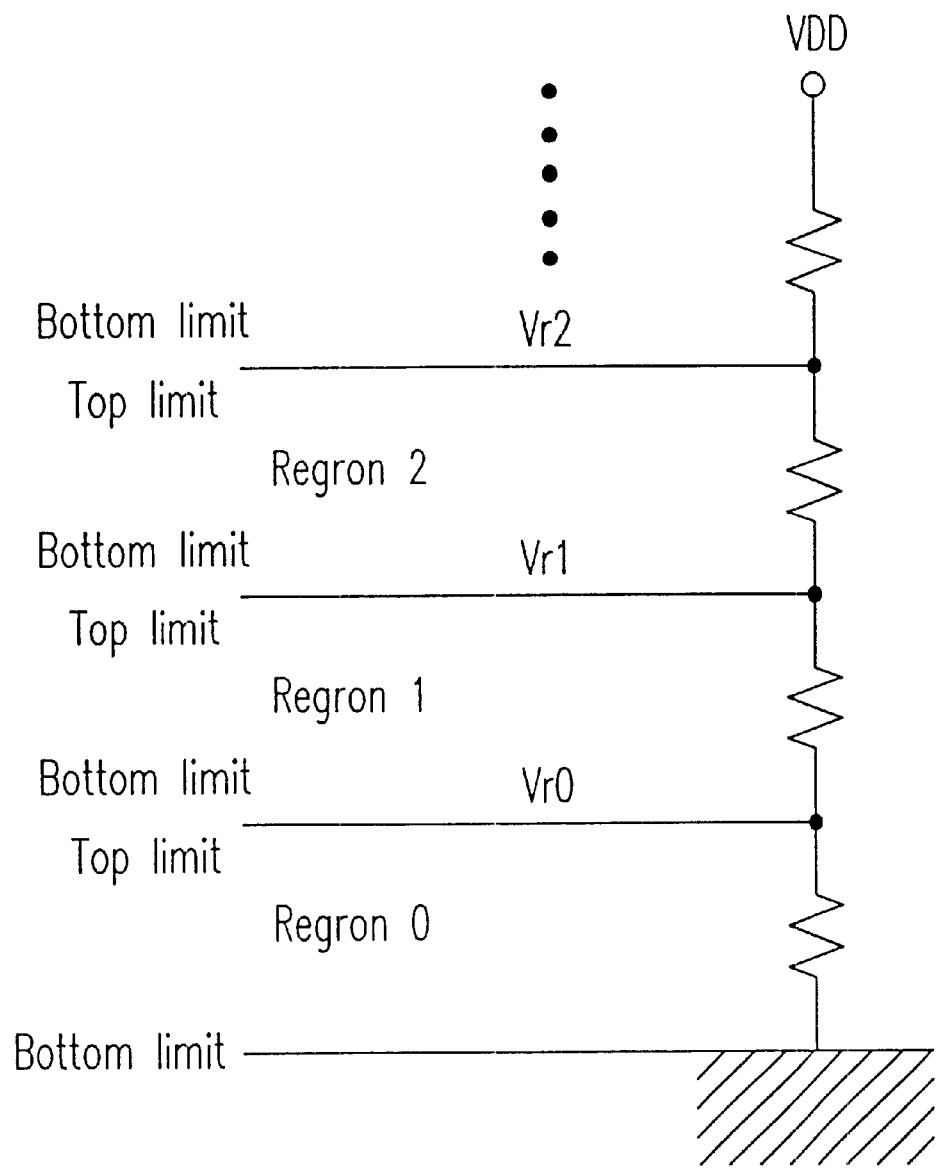
FIG. 8 illustrates the structure of voltage-dividing serial resistors according to the present invention.

Referring to FIG. 8, the voltage-dividing serial resistor 672 can comprise a plurality of series-connection resistors and divides an outer-voltage VDD into plural voltage regions (i.e. region 0, region 1, region 2, and region 3 . . . ). Each of the voltage regions has an top limit and bottom limit, wherein the top limit of the region N is the bottom limit of the region N+1 and the bottom limit of the region N is the top limit of the region N−1.

Figure 9:
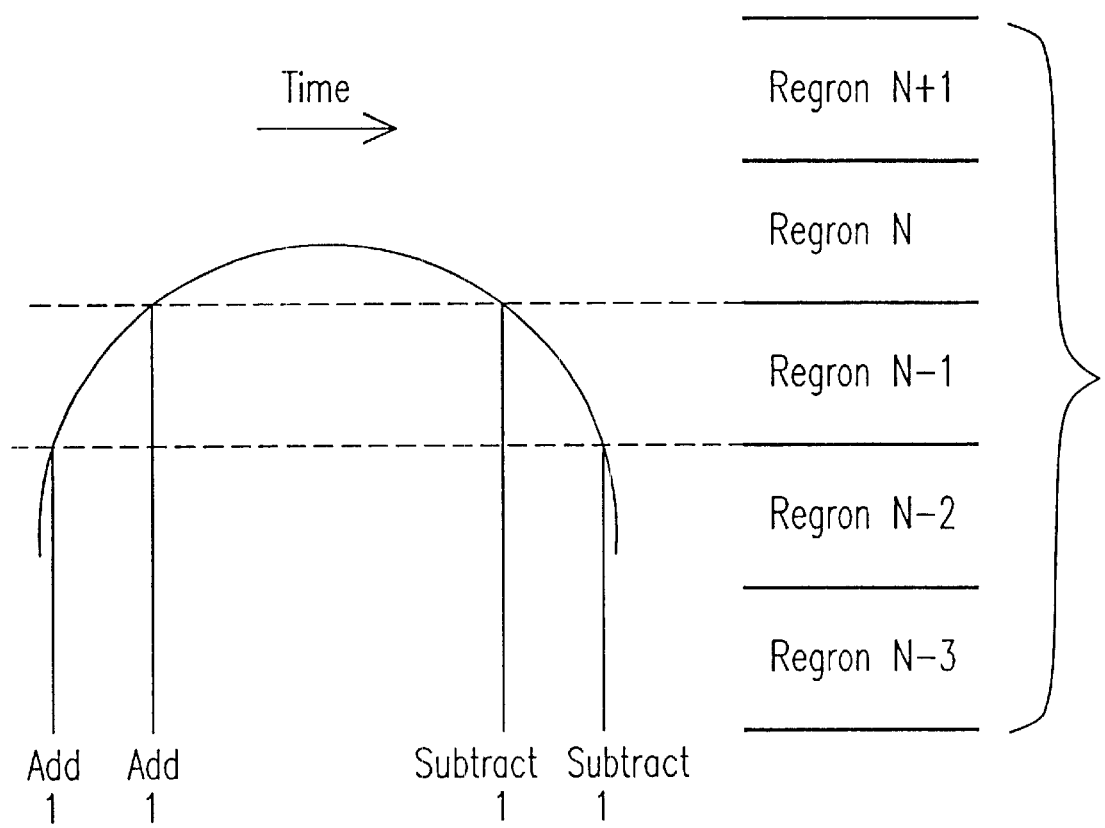
FIG. 9 illustrates a relative maximum signal detected by a detecting circuit of the present invention.

FIG. 9 illustrates a relative maximum signal detected by a detecting circuit of the present invention. Furthermore referring to FIG. 7, when the voltage of the input signal 60 increases to be larger than the top limit of the region N, the up/down counter 622 adds one and the analog multiplexer 672 increases the region of the potential-calibrating signal 6302 from N to N+1. Moreover, when the voltage of the input signal 60 becomes to decrease, the up/down counter 622 subtracts one, wherein it means that the input signal 60 achieves the relative maximum value and the relative maximum signal 6402 is stored into the maximum signal latch 642.

Figure 10:
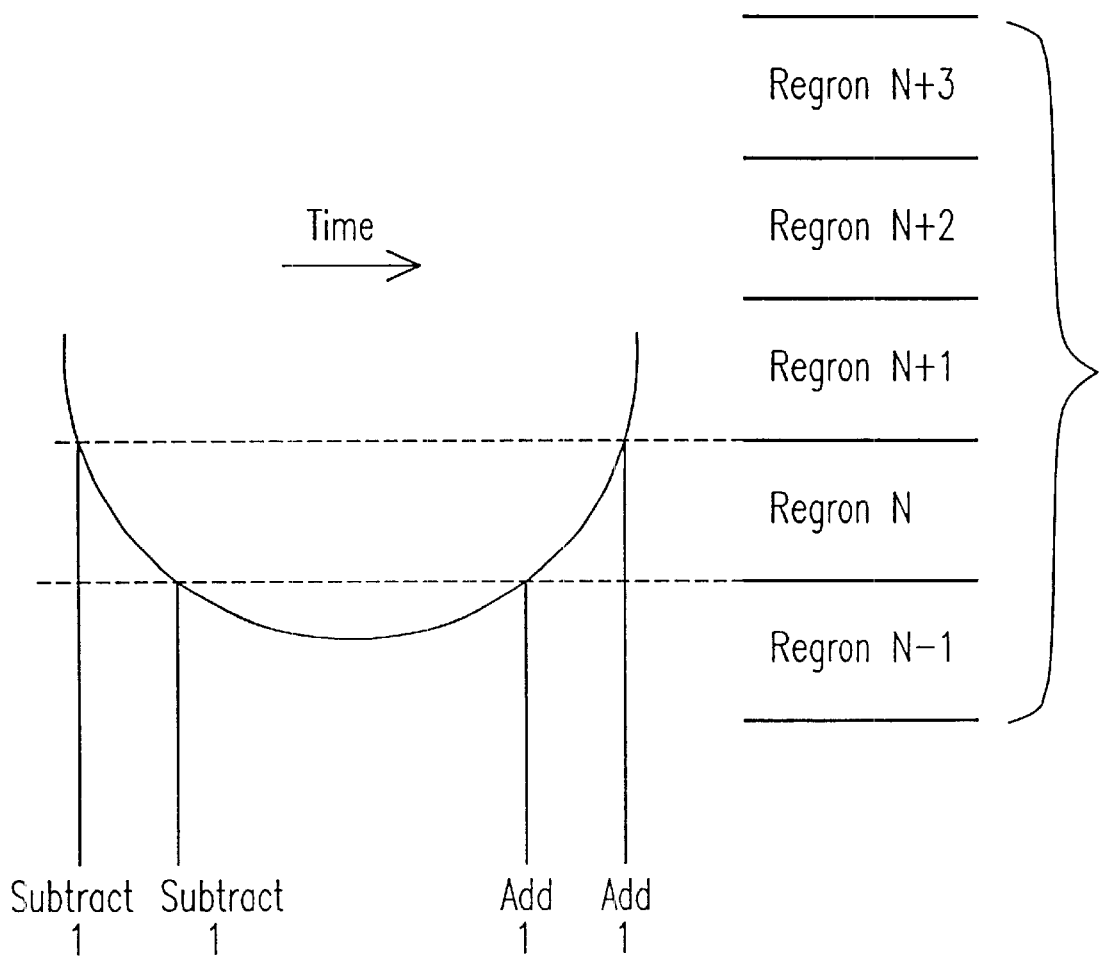
FIG. 10 illustrates a relative minimum signal detected by a detecting circuit of the present invention.
Figure 11A:
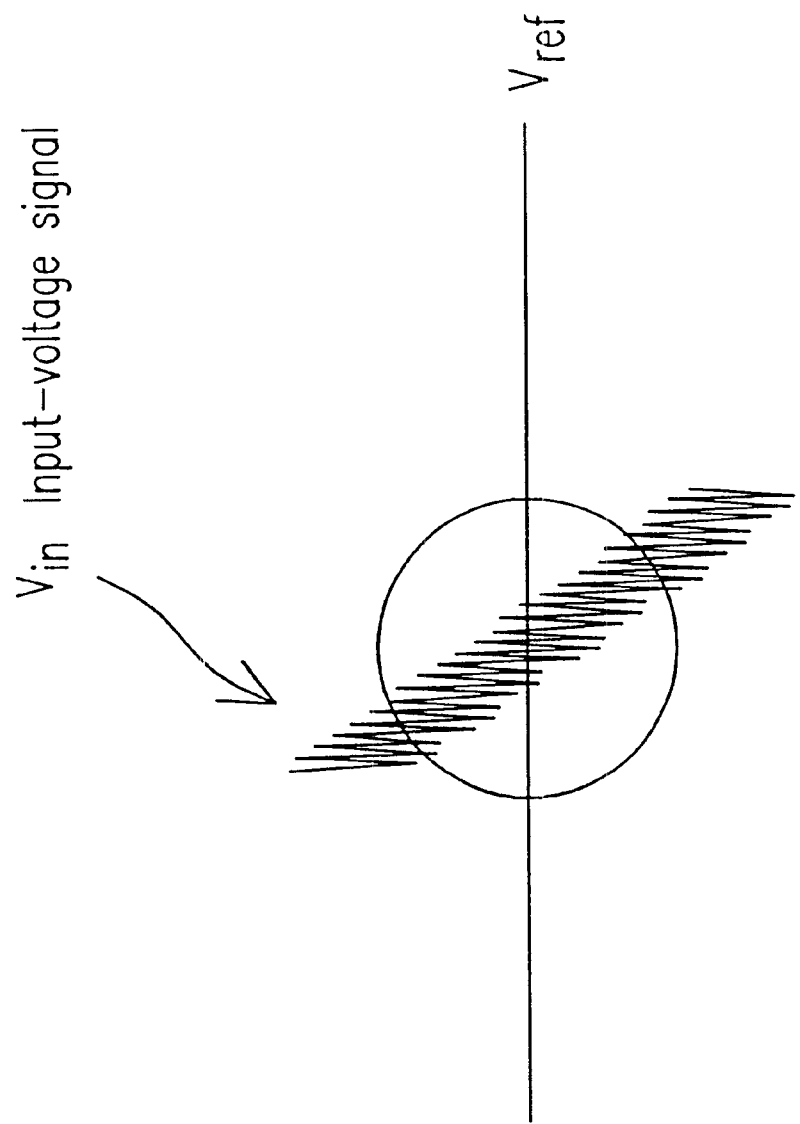
FIG. 11(a) illustrates an amplified input-voltage signal similar to the regulated reference voltage.
Figure 11B:
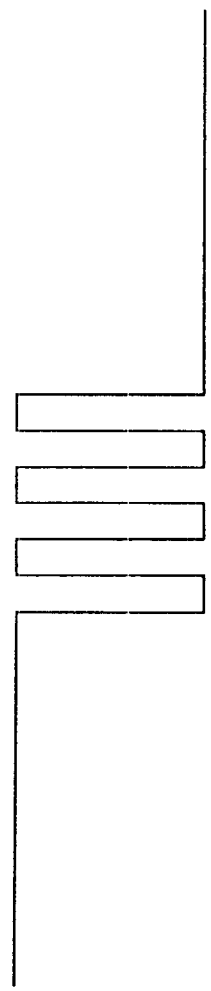
FIG. 11(b) illustrates how a digital output signal has abnormal numbers of square waves caused by noise effects.

FIG. 10 illustrates a relative minimum signal detected by a detecting circuit of the present invention. Again referring to FIG. 7, when the voltage of the input signal 60 decreases to be lower than the top limit of the region N, the up/down counter 622 subtracts one and the analog multiplexer 672 decreases the region of the potential-calibrating signal 6302 from N to N−1. Moreover, when the voltage of the input signal 60 becomes to increase, the up/down counter 622 adds one, wherein it means that the input signal 60 achieves the relative minimum value and the relative minimum signal 6401 is stored into the minimum signal latch 641.

Figure 1:
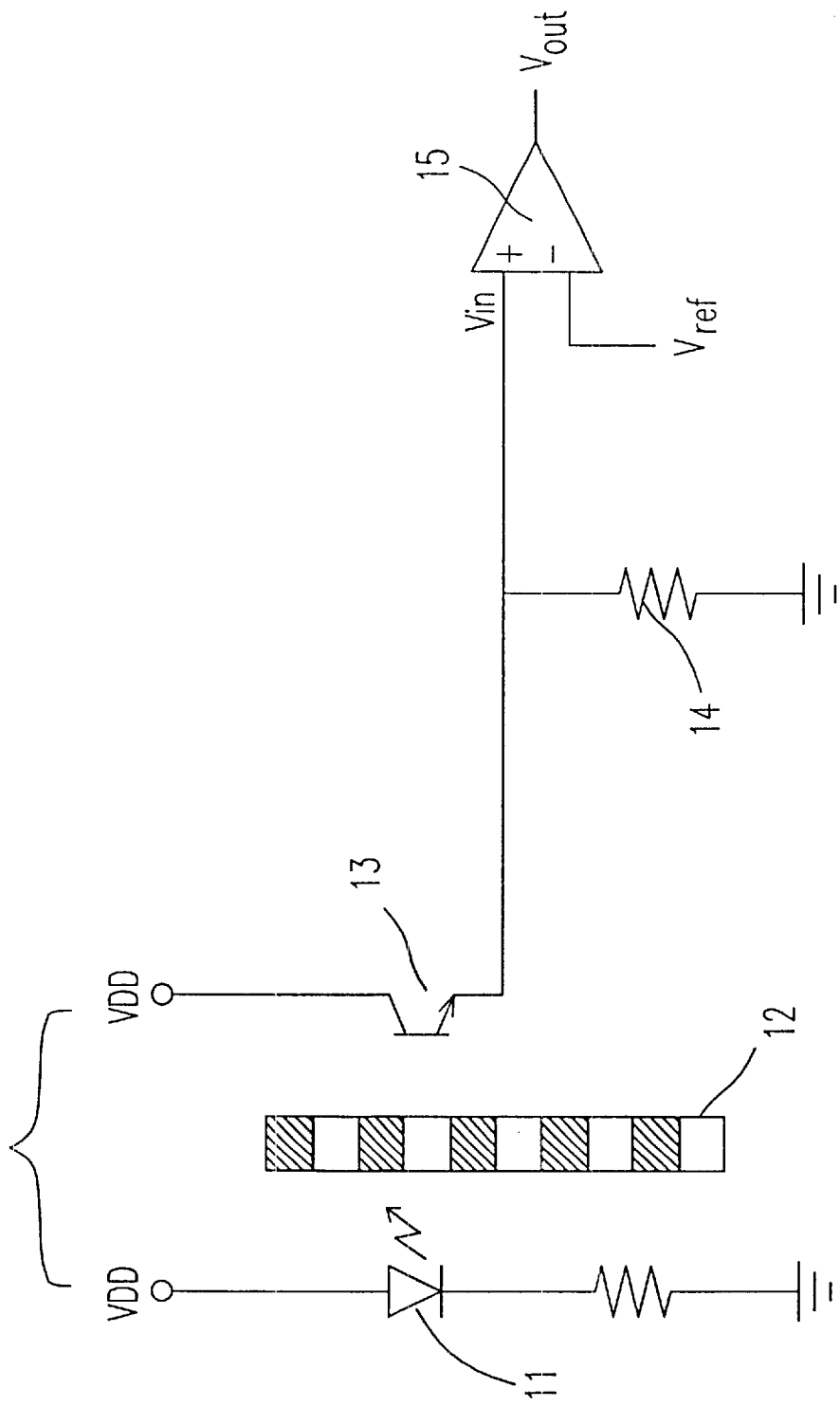
FIG. 1 depicts a circuit of a prior mouse.
Figure 2A:
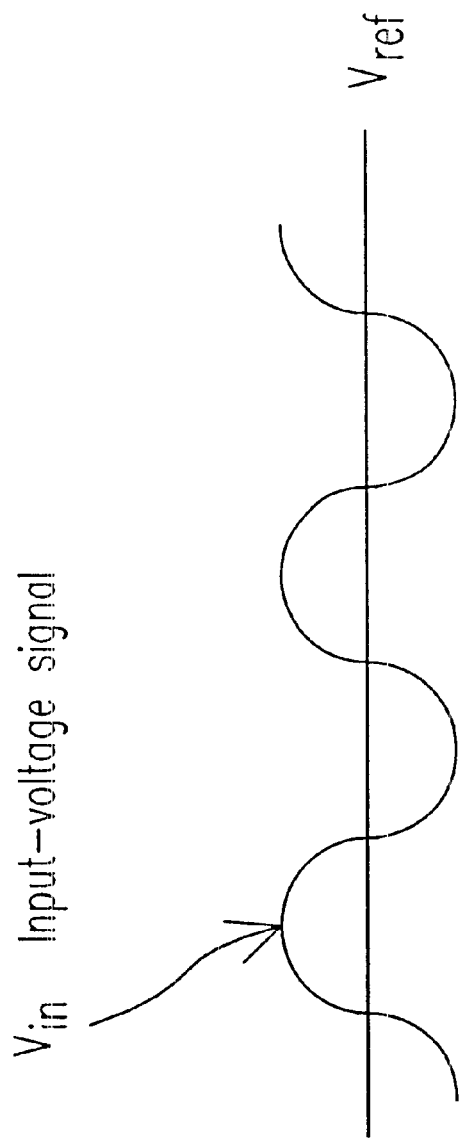
FIGS. 2(a) and 2(b) illustrate an analog-input-voltage signal and a digital-output-voltage signal obtained from the prior photo-product in an ideal situation.
Figure 2B:
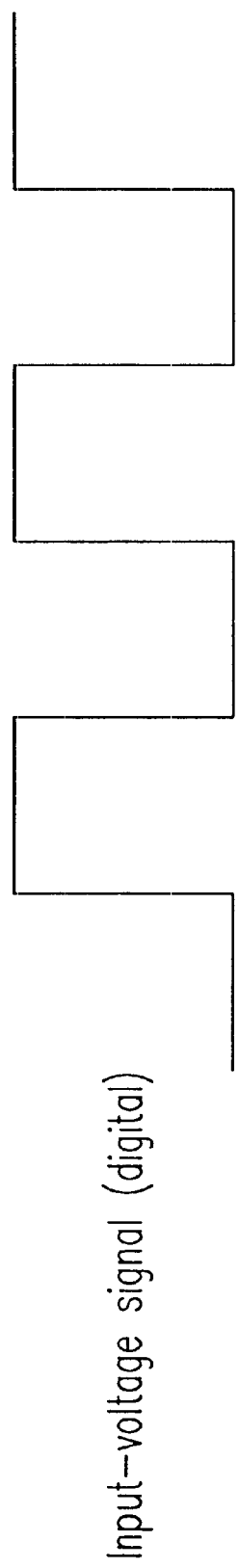
Figure 3:
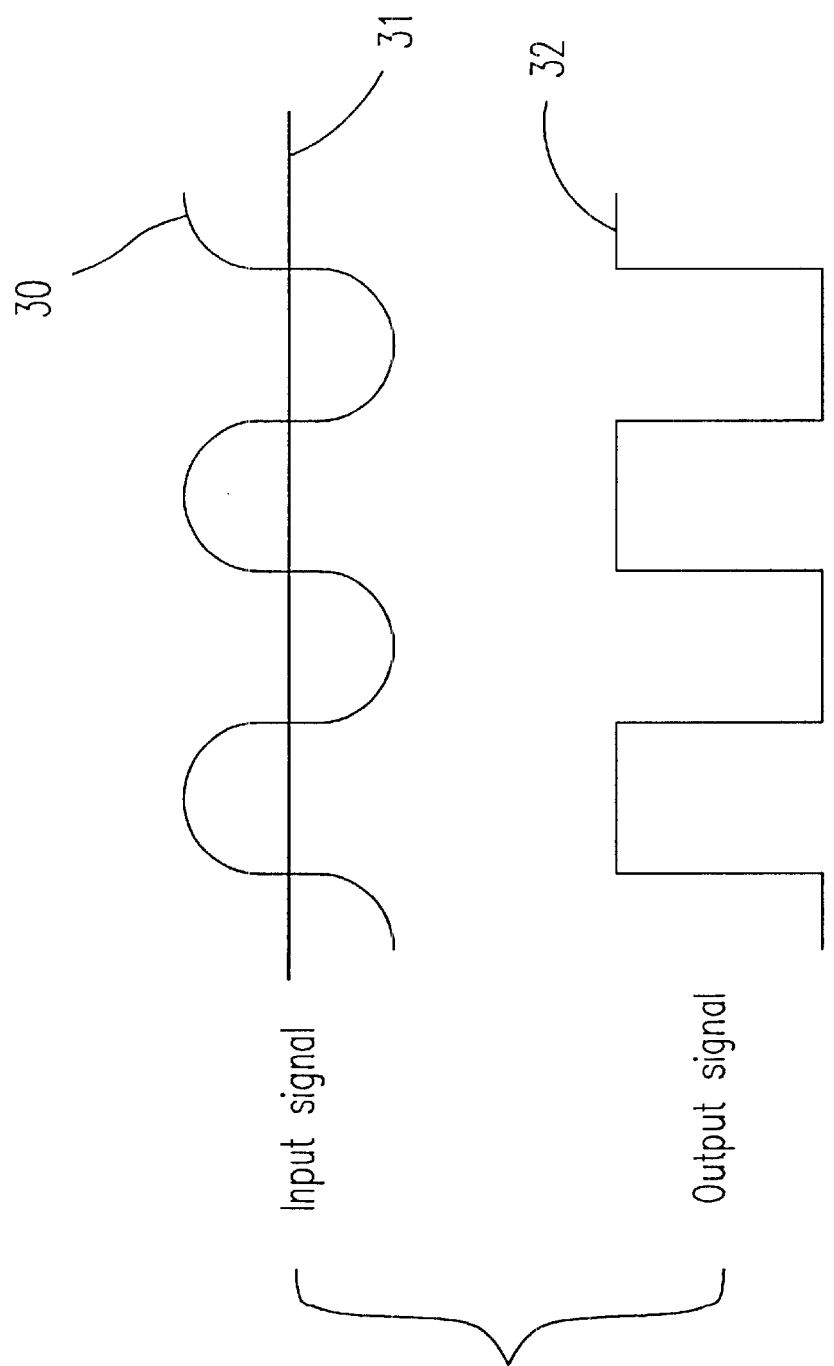
FIG. 3 illustrates a reference voltage, an input signal and an output signal.
Figure 4:
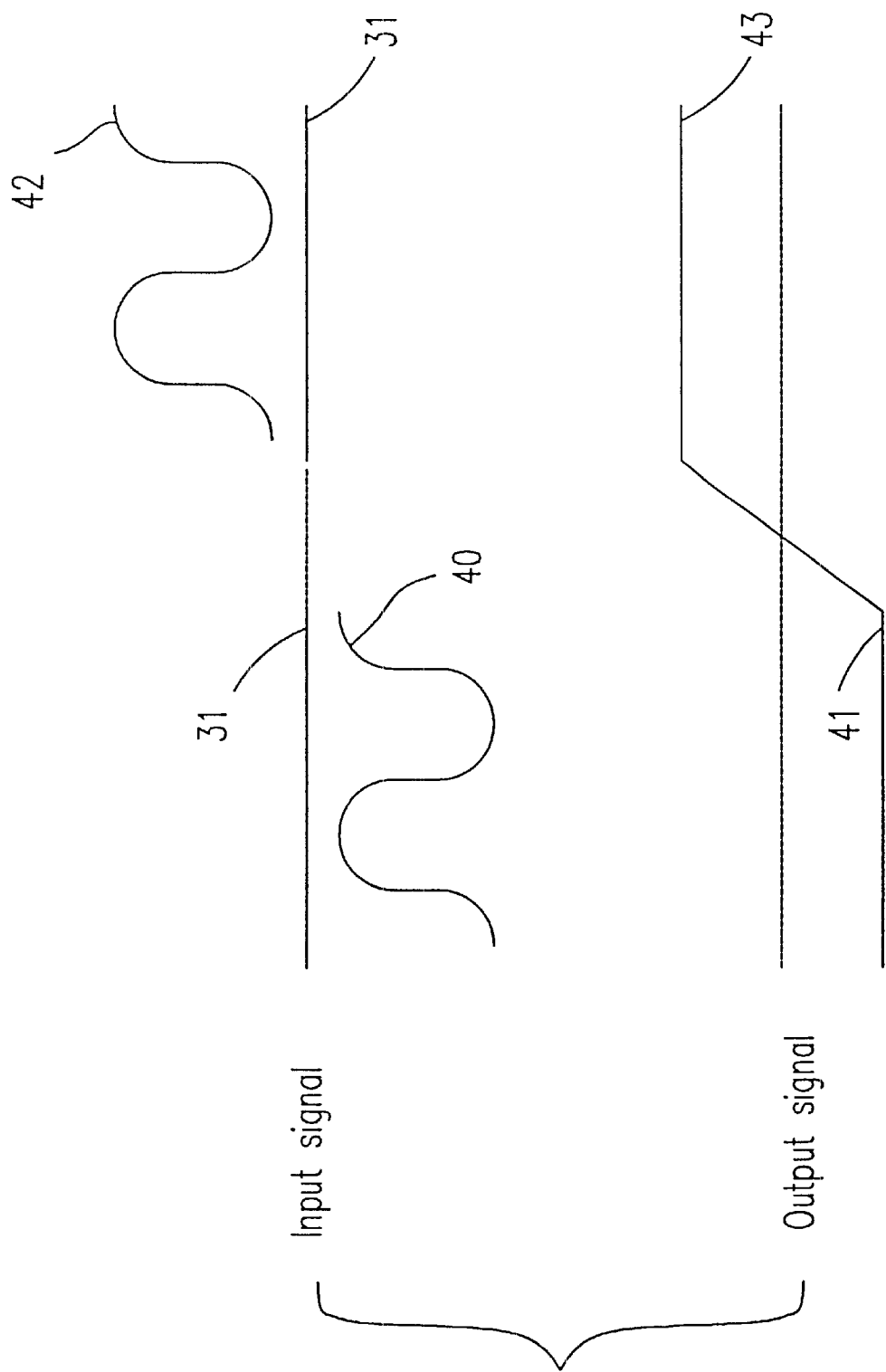
FIG. 4 illustrates an error signal produced by the prior photo-product.
Figure 12A:
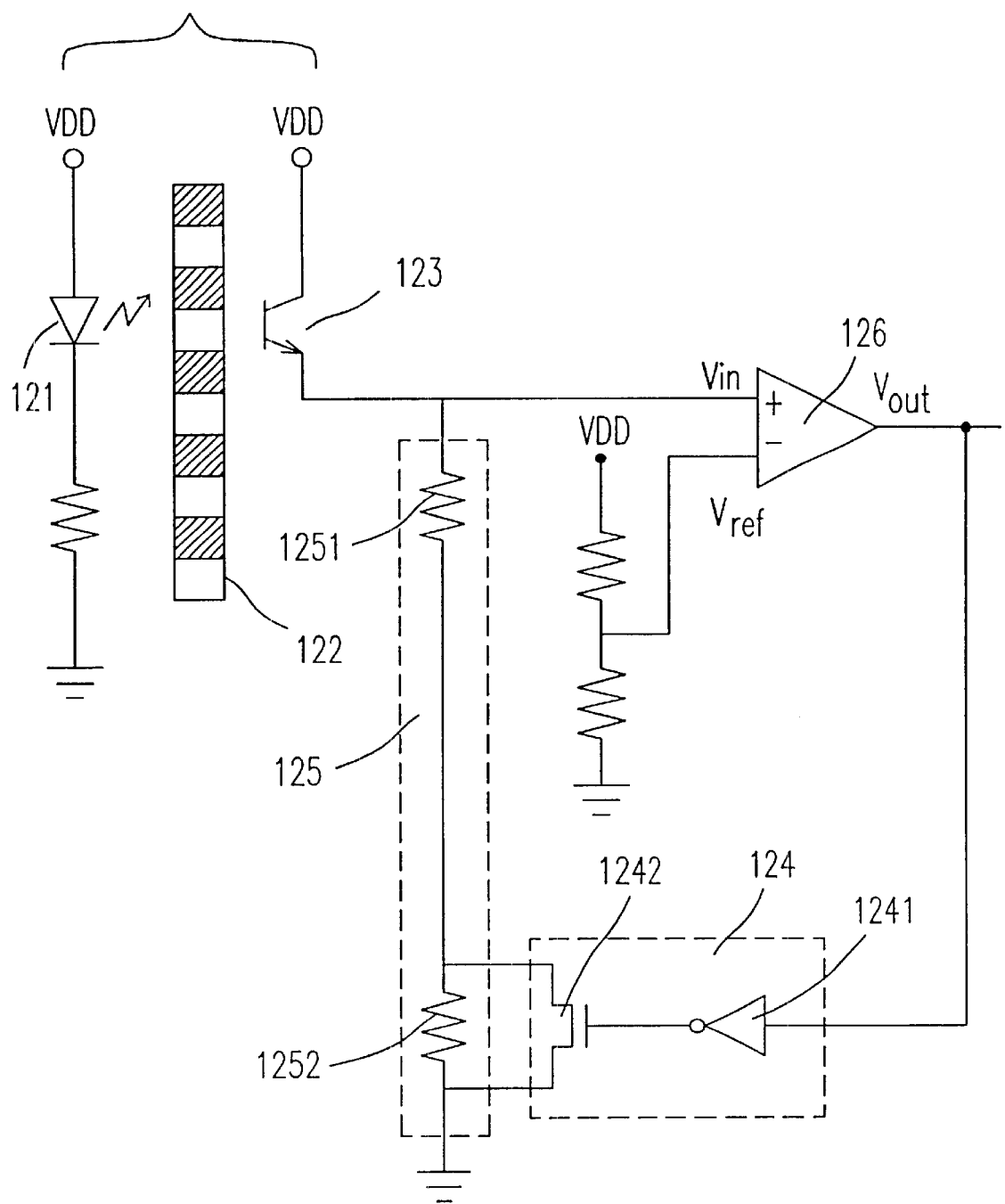
FIGS. 12(a) and 12(b) illustrate respectively the first and the second preferred embodiments of voltage-comparing circuits of the present invention.
Figure 12B:
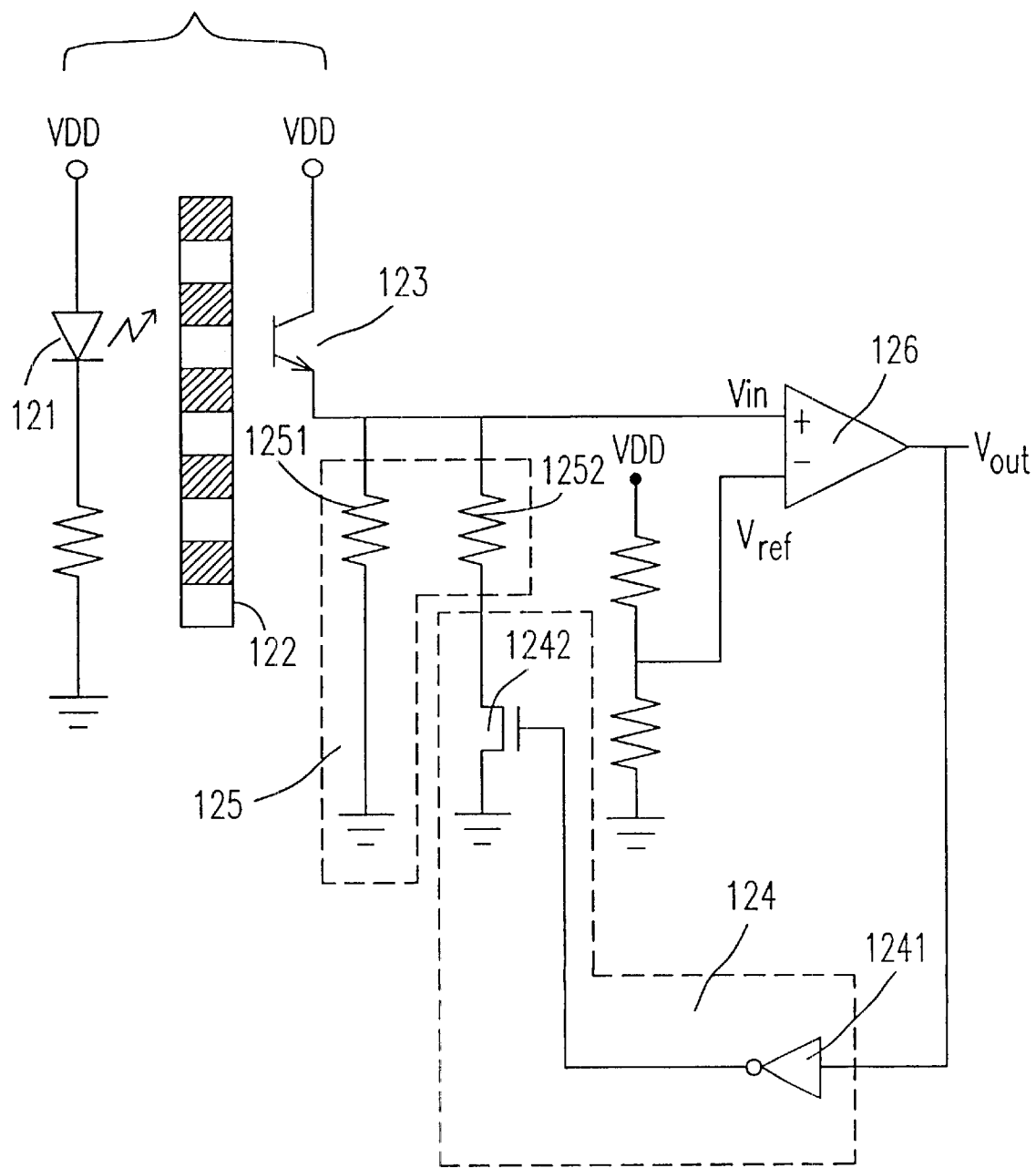
Figure 13:
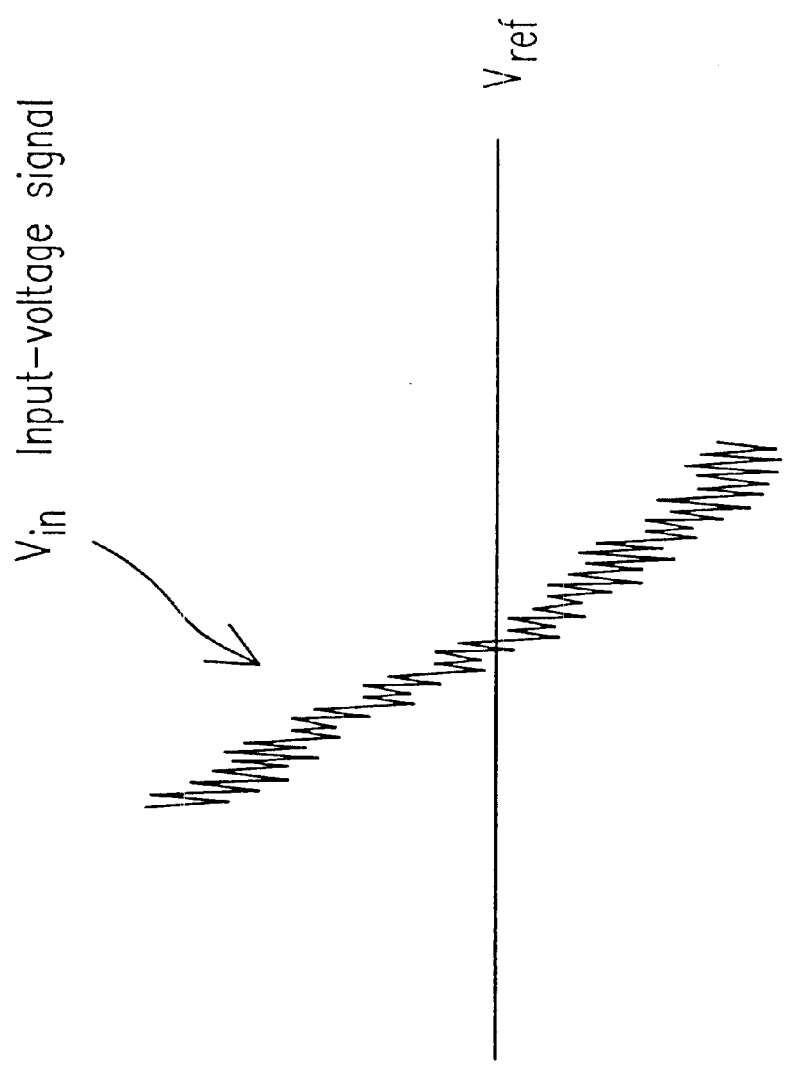
FIG. 13 illustrates waves of analog input-voltage signals and regulated reference voltage of FIGS. 12(a) and 12(b)
Figure 14A:
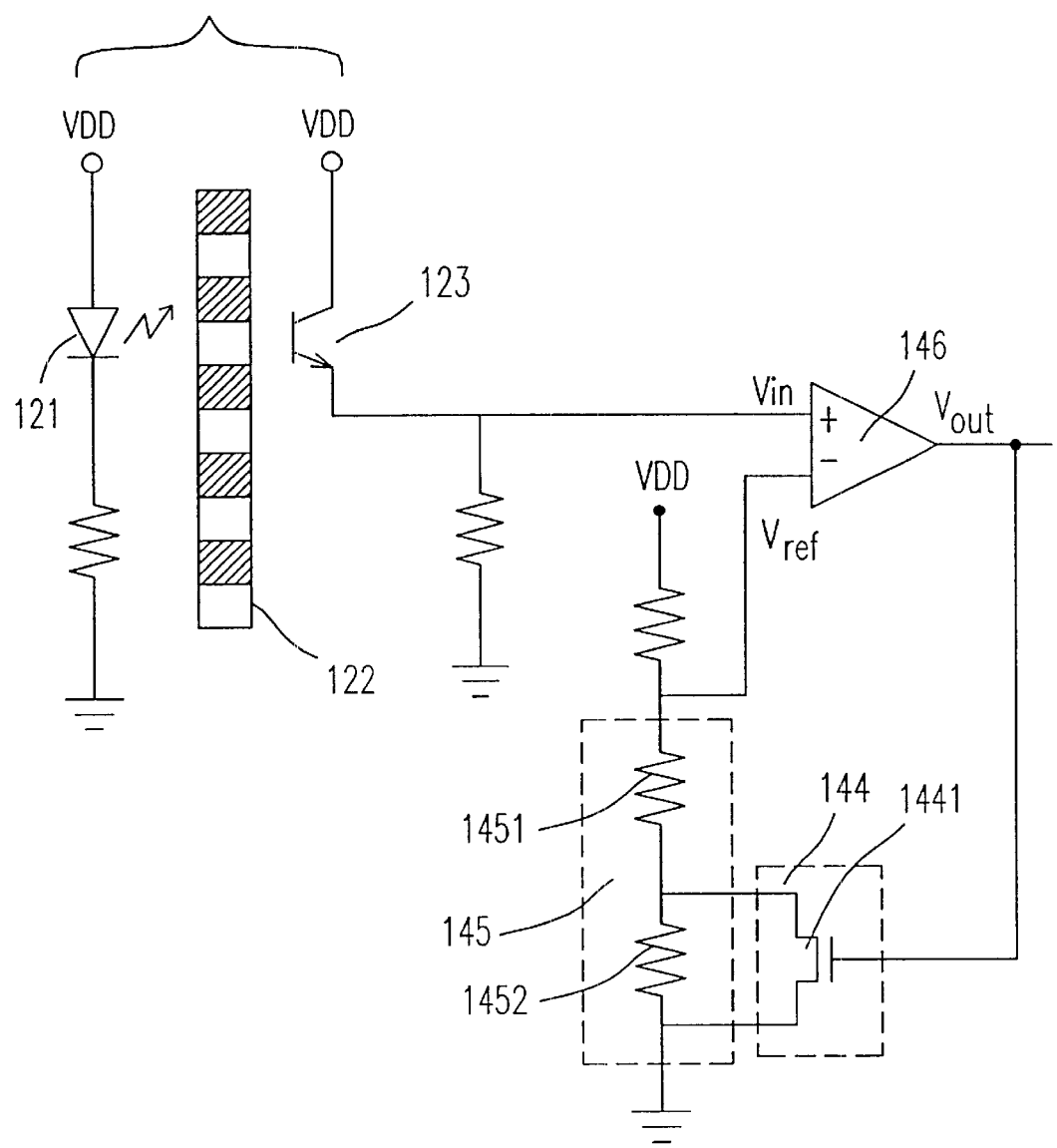
FIGS. 14(a) and 14(b) illustrate respectively the third and the fourth preferred embodiments of voltage-comparing circuits of the present invention.

FIG. 12(a) illustrates the first preferred embodiment of voltage-comparing circuits of the present invention, wherein the light-emitting diode 121, the phototransistor 123 and the raster-wheel 122 are the same as those shown in FIG. 1. The photo-transistor 123 outputs a current signal like sine waves with noises into the voltage-comparing circuits of the first preferred embodiment of the present invention and obtains a digital input-voltage signal Vin. The digital input-voltage signal Vin won't cause the prior problem of transforming abnormal numbers of square waves or the follow-up circuit to calculate wrong and make the control cursor of the mouse move incorrectly. According to the present invention, the comparing circuit 126, an operational-amplifier circuit, has a first voltage-input end, a second voltage-input end and a voltage-output end, wherein the input voltage Vin and the reference voltage Vref are inputted respectively through the first voltage-input end and the second voltage-input end into the comparing circuit 126. Then, an output voltage Vout is outputted at a first level value while the value of the input voltage Vin is larger than that of the reference voltage Vref, and an output voltage Vout is outputted at a second level value while the value of the input voltage Vin is smaller than that of the reference voltage Vref. The present invention also provides a feedback control circuit 124 electrically connected between the voltage-output end and the first voltage-input end to adjust the input voltage down a noise-enduring value for preventing the voltage-comparing device from the disturbance of the input voltage. FIG. 14(a) shows that the photo-transistor 123 outputs a current signal like sine waves with noises into a resistance device 125 and obtains a digital input-voltage signal Vin, wherein the resistance device further comprises a first resistor 1251 and a second resistor 1252 connected with the first resistor 1251 in series. Moreover, the feedback control circuit 124, a control switch, further comprises an inverter 1241 connected with the voltage-output end for converting the second level value into a conducting-voltage output value Vout, and a MOS transistor 1242 having a gate electrically connected with the inverter 1241 and a source/drain electrically connected with the second resistor 1252 in parallel to be conducted in response to the conducting-voltage output value, thereby shorting the second resistor 1252 to reduce the total resistance value of the resistance device 125.

FIG. 12(a) illustrates the first preferred embodiment of voltage-comparing circuits of the present invention, wherein the resistance device 125 comprises a first resistor 1251 and a second resistor 1252 electrically connected with the first resistor 1251 in parallel, the feedback control circuit 124 is a control switch electrically connected with the voltage-output Vout, and the second resistor 1252 is serially connected to the ground to conduct the resistance device 125 while the voltage-output end outputs the output voltage Vout at the second level value, thereby connecting the second resistor 1252 with the ground and reducing the total resistance value of the resistance device 125 for adjusting the input voltage down a noise-enduring value while the voltage-output end outputs the output voltage at the first level value, and preventing the voltage comparing device from the disturbance of the input voltage.

According to the present invention, the FIG. 14(a) shows the third preferred embodiment of the voltage-comparing device, wherein a feedback control circuit 144 is electrically connected between the voltage-output end and the second voltage-input end for adjusting the reference voltage down a noise-enduring value while the voltage-output end outputs the output voltage at the first level value, thereby preventing the voltage comparing device from the disturbance of the input voltage. The second voltage-input end electrically connects with a resistance device 145 comprising a first resistor 1451 and a second resistor 1452 connected with the first resistor 1451 in series for obtaining a partial voltage. The feedback control circuit 144 further comprises a MOS transistor 1441 electrically connected between the voltage-output end and the second voltage-input end to short the second resistor 1452 to reduce the total resistance value of the resistance device 145 for preventing the voltage comparing device from the disturbance of the input voltage while the voltage-output end outputs the output voltage at the first level value.

Figure 14B:
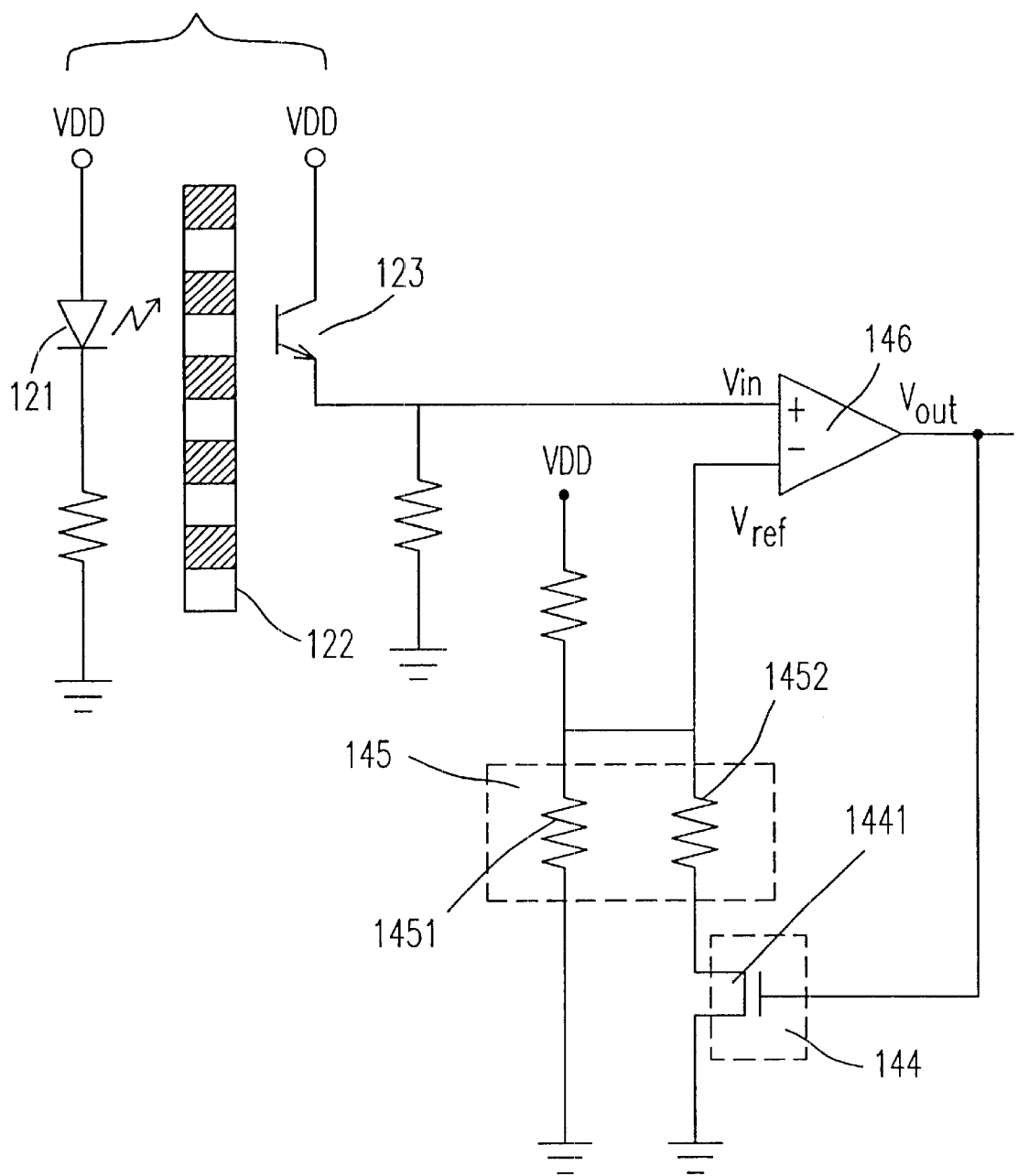
Figure 15:
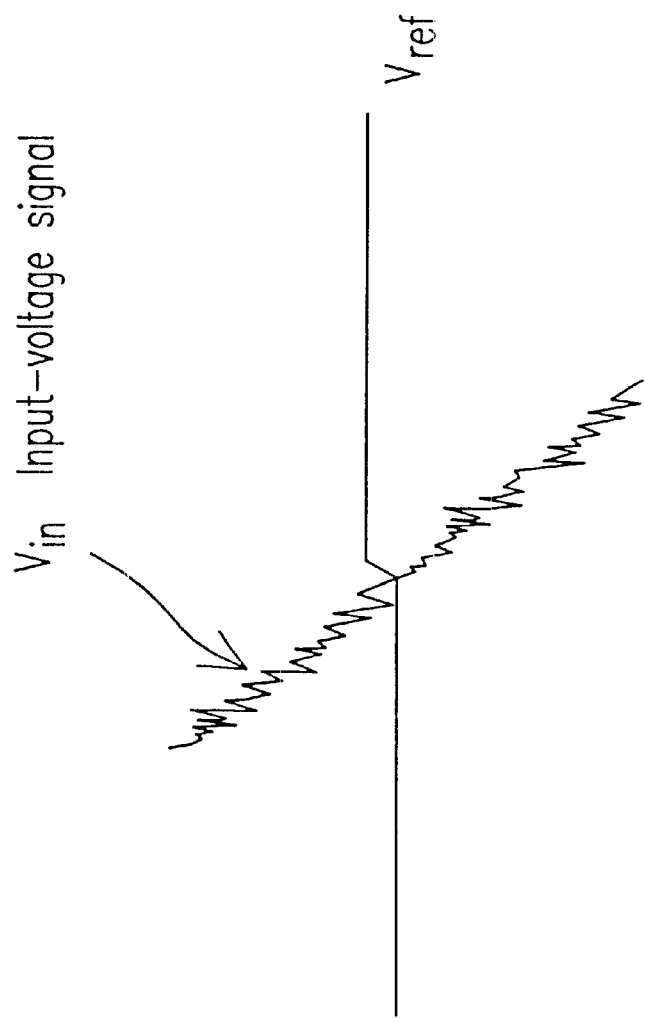
FIG. 15 illustrates waves of analog input-voltage signals and regulated reference voltage of FIGS. 14(a) and 14(b)

FIG. 14(*b*) illustrates the fourth preferred embodiment of voltage-comparing circuits of the present invention, wherein a feedback control circuit 144 is electrically connected between the voltage-output end and the second voltage-input end for adjusting the reference voltage down a noise-enduring value while the voltage-output end outputs the output voltage at the first level value, thereby preventing the voltage comparing device from the disturbance of the input voltage. The second voltage-input end electrically connects with a resistance device 145 comprising a first resistor 1451 and a second resistor 1452 connected with the first resistor 1451 in parallel for obtaining a partial voltage. The feedback control circuit 144 further comprises a MOS transistor 1441 electrically connected between the voltage-output end and the second voltage-input end to conduct the second resistor 1452 to the ground to reduce the total resistance value of the resistance device 145 for preventing the voltage comparing device from the disturbance of the input voltage while the voltage-output end outputs the output voltage at the first level value.

Figure 16A:
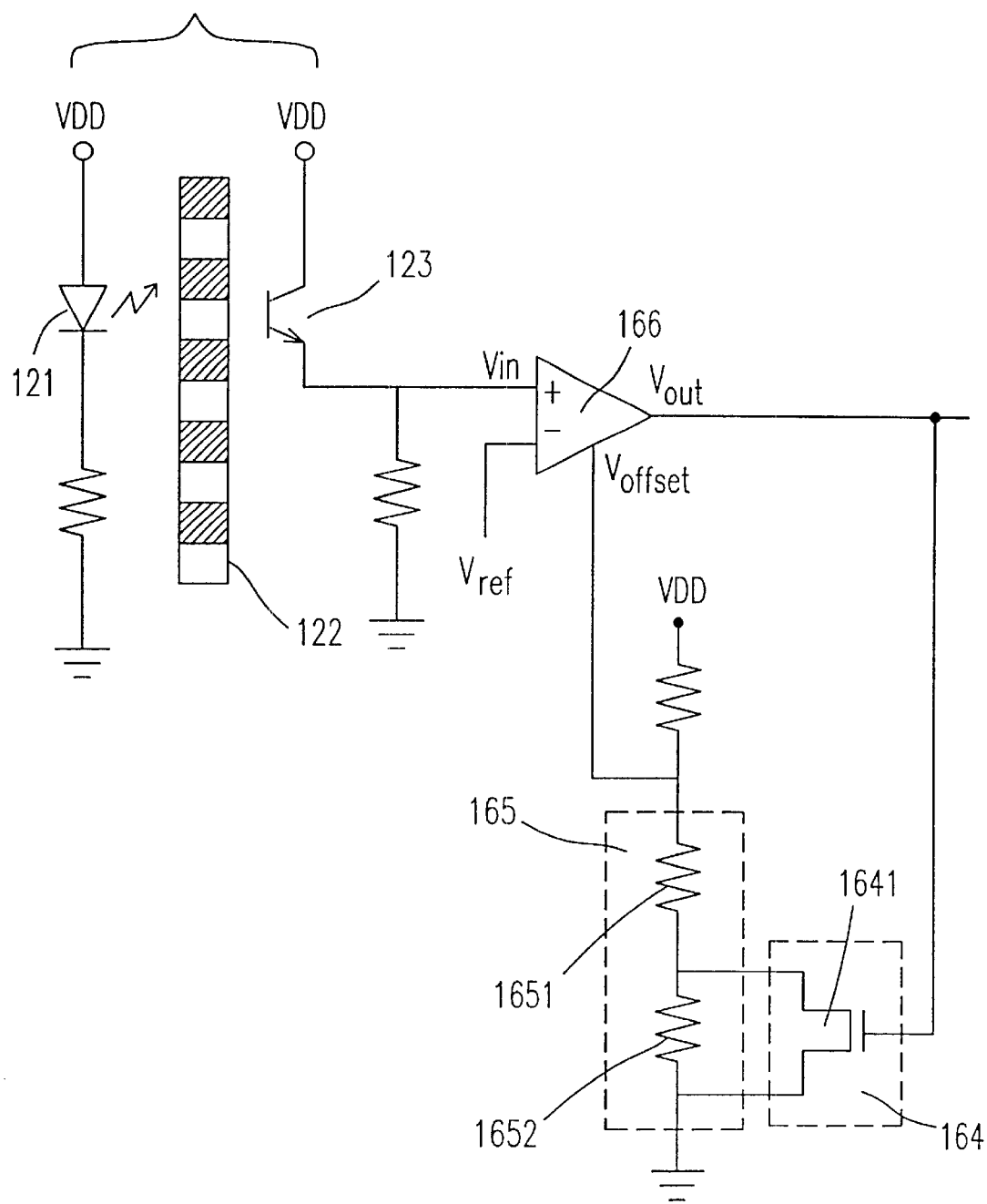
FIGS. 16(a) and 16(b) illustrate respectively the fifth and the sixth preferred embodiments of voltage-comparing circuits of the present invention.
Figure 16B:
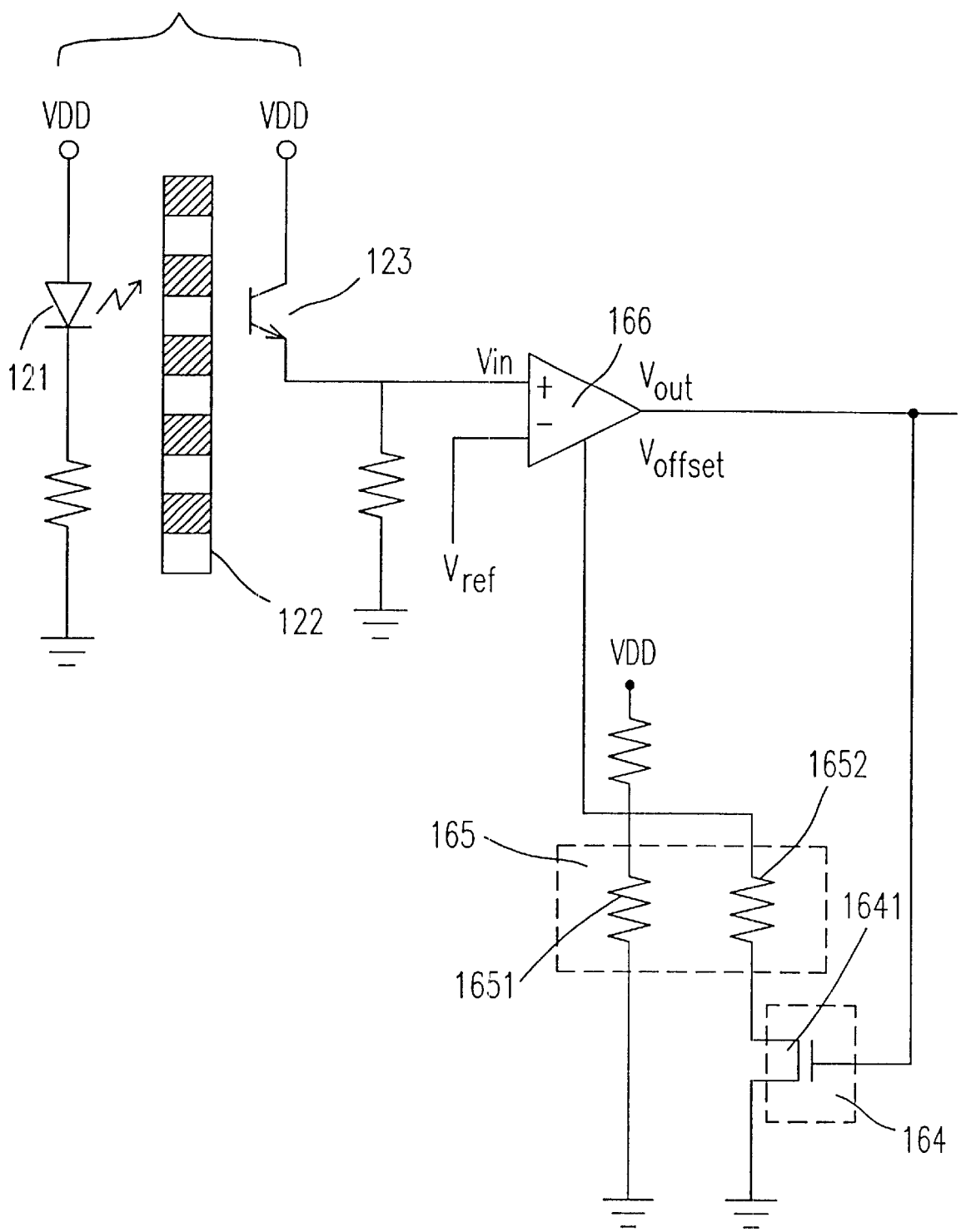

Further referring to FIG. 16(*a*), it illustrates the fifth preferred embodiment of the voltage-comparing circuit of the present invention. The voltage-comparing circuit comprises a comparing circuit having a first voltage-input end, a second voltage-input end, a voltage-output end and a voltage-offset input end, wherein the input voltage, the reference voltage and an offset voltage are inputted respectively through the first voltage-input end, the second voltage-input end and the voltage-offset input end, an output voltage is outputted at a first level value while the sum value of the reference voltage and the offset voltage is smaller than the input voltage, and an output voltage is outputted at a second level value while the sum value of the reference voltage and the offset voltage is larger than the input voltage. The voltage-comparing circuit further comprises a feedback control circuit 164 electrically connected between the voltage-output end and the voltage-offset input end for adjusting the offset voltage down a noise-enduring value while the voltage-output end outputs the output voltage at the first level value, thereby preventing the voltage comparing device from the disturbance of the input voltage. The second voltage-input end electrically connects with a resistance device 165 comprising a first resistor 1651 and a second resistor 1652 connected with the first resistor 1651 in series for obtaining a partial voltage. The feedback control circuit 164 further comprises a MOS transistor 1641 electrically connected between the voltage-output end and the voltage-offset input end to short the second resistor 1652 to reduce the total resistance value of the resistance device 165 for preventing the voltage comparing device from the disturbance of the input voltage while the voltage-output end outputs the output voltage at the first level value.

FIG. 16(*b*) illustrates the sixth preferred embodiment of voltage-comparing circuits of the present invention, wherein a feedback control circuit 164 is electrically connected between the voltage-output end and the voltage-offset input end for adjusting the offset voltage down a noise-enduring value while the voltage-output end outputs the output voltage at the first level value, thereby preventing the voltage comparing device from the disturbance of the input voltage. The second voltage-input end electrically connects with a resistance device 165 comprising a first resistor 1651 and a second resistor 1652 connected with the first resistor 1651 in parallel for obtaining a partial voltage. The feedback control circuit 164 further comprises a MOS transistor 1641 electrically connected between the voltage-output end and the voltage-offset input end to conduct the second resistor 1652 to the ground to reduce the total resistance value of the resistance device 165 for preventing the voltage comparing device from the disturbance of the input voltage while the voltage-output end outputs the output voltage at the first level value.

Accordingly, the present invention provides a voltage-comparing device transforming the digital output signal and sending a feedback to control the input resistance device, reference voltage and the offset voltage for preventing the voltage comparing device from the disturbance of noises as in the prior art.

Although the present invention has been described and illustrated in detail, it is to be clearly understood that the same is by the way of illustration and example only and is not to be taken by way of limitation, the spirit and scope of the present invention being limited only by the terms of the appended claims.

What is claimed is:

1. An analog-signal converter comprising:
   a reference-voltage detecting circuit for outputting a reference-voltage signal in response to an input signal; and
   a first comparing device for comparing said input signal and said reference-voltage signal to obtain an output digital signal, wherein said reference-voltage detecting circuit comprises:
   a second comparing device for comparing input signal and a potential-calibrating signal to obtain an index signal;
   a voltage-follower control device electrically connected with said second comparing device for outputting a potential-control signal and a counting signal in response to said index signal and a pulse signal;
   a voltage-follower device electrically connected between said second comparing device and said voltage-follower control device for outputting said potential-calibrating signal in response to said potential-control signal;
   a detecting device electrically connected with said voltage-follower device and said voltage-follower control device for detecting said counting signal, said potential-calibrating signal and said pulse signal to obtain an extreme signal;
   an operational device electrically connected with said detecting device for operating said extreme signal to output an average signal;
   a signal converter electrically connected with said operational device for executing a signal-converting procedure by inputting said average signal to output a dynamic reference-voltage signal; and
   a pulse generator electrically connected with said voltage-follower device and said detecting device for producing said pulse signal to obtain said dynamic reference-voltage signal.

2. The analog-signal converter according to claim 1, wherein said input signal is an analogy signal.

3. The analog-signal converter according to claim 1, wherein said input signal is a waveform signal obtained from a photoelectric convertion.

4. The analog-signal converter according to claim 1, wherein said first comparing device is a comparator.

5. The analog-signal converter according to claim 4, wherein said comparator compares said input signal with said reference-voltage signal and obtains a first-state digital signal while the potential of said input signal is larger than that of said reference-voltage signal and a second-state digital signal while the potential of said input signal is smaller than that of said reference-voltage signal.

6. The analog-signal converter according to claim 1, wherein said second comparing device further comprises an upper comparator and a lower comparator.

7. The analog-signal converter according to claim 6, wherein said index signal further comprises an upper index signal outputted from said upper comparator and a lower index signal outputted from said lower comparator.

8. The analog-signal converter according to claim 7, wherein said potential-calibrating signal further comprises a potential-calibrating upper signal and a potential-calibrating lower signal.

9. The analog-signal converter according to claim 8, wherein said upper comparator outputs said upper index signal in response to said input signal and said potential-calibrating upper signal in said second comparing procedure.

10. The analog-signal converter according to claim 8, wherein said lower comparator outputs said lower index signal in response to said input signal and said potential-calibrating lower signal in said second comparing procedure.

11. The analog-signal converter according to claim 8, wherein said upper index signal and said lower index signal are digital signals.

12. The analog-signal converter according to claim 8, wherein said second comparator compares said input signal with said potential-calibrating signal for obtaining a first-state digital signal while the potential of said input signal is larger than that of said potential-calibrating and a second-state digital signal while the potential of said input signal is smaller than that of said potential-calibrating signal.

13. The analog-signal converter according to claim 1, wherein said voltage-follower control device further comprises an input-voltage-tracing circuit and an up/down counter electrically connected with said input-voltage-tracing circuit.

14. The analog-signal converter according to claim 13, wherein said input-voltage-tracing circuit outputs said counting signal in response to said index signal.

15. The analog-signal converter according to claim 14, wherein said up/down counter outputs said potential-control signal in response to said counting signal in an operational procedure.

16. The analog-signal converter according to claim 15, wherein said operational procedure further comprises an upper count procedure and a lower count procedure.

17. The analog-signal converter according to claim 15, wherein said voltage-follower device further comprises a voltage-dividing serial resistor and an analog multiplexer connected with each other.

18. The analog-signal converter according to claim 17, wherein said voltage-dividing serial resistor comprises a plurality of series-connection resistors and divides an outer-voltage region into a plurality of potential regions.

19. The analog-signal converter according to claim 18, wherein said analog multiplexer adjusts contacts between said analog multiplexer and said voltage-dividing serial resistor and obtains desired potential regions in response to said potential-control signal.

20. The analog-signal converter according to claim 1, wherein said extreme signal further comprises a relative maximum signal and a relative minimum signal.

21. The analog-signal converter according to claim 20, wherein said relative maximum signal and said relative minimum signal are serial signals.

22. The analog-signal converter according to claim 21, wherein said detecting device further comprises an extreme detecting circuit, a maximum latch and a minimum latch, wherein said maximum latch and said minimum latch connect to said extreme detecting circuit respectively.

23. The analog-signal converter according to claim 21, wherein said operational device further comprises an average device and a signal-latch circuit.

24. The analog-signal converter according to claim 23, wherein said average device outputs said average signal in response to said relative maximum signal and said relative minimum signal.

25. The analog-signal converter according to claim 1, wherein said signal converter further comprises a voltage-dividing serial resistor and an analog multiplexer connected with each other.

26. The analog-signal converter according to claim 1, wherein said signal-converting procedure is a procedure of converting a digital signal into an analog signal.

27. The analog-signal converter according to claim 1, wherein said operational procedure is a procedure of obtaining an arithmetic average of said relative maximum and said relative minimum.

* * * * *